(12) United States Patent
Hebert

(10) Patent No.: US 9,601,453 B2
(45) Date of Patent: Mar. 21, 2017

(54) SEMICONDUCTOR PACKAGE

(71) Applicant: MagnaChip Semiconductor, Ltd., Cheongju-si (KR)

(72) Inventor: Francois Hebert, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 326 days.

(21) Appl. No.: 14/104,805

(22) Filed: Dec. 12, 2013

(65) Prior Publication Data
US 2015/0001618 A1    Jan. 1, 2015

(30) Foreign Application Priority Data
Jun. 28, 2013 (KR) .................. 10-2013-0075983

(51) Int. Cl.
H01L 21/00 (2006.01)
H01L 23/00 (2006.01)
H01L 23/31 (2006.01)
H01L 23/495 (2006.01)

(52) U.S. Cl.
CPC ........ *H01L 24/40* (2013.01); *H01L 23/49537* (2013.01); *H01L 23/49541* (2013.01); *H01L 23/49575* (2013.01); *H01L 24/37* (2013.01); *H01L 24/41* (2013.01); *H01L 23/3107* (2013.01); *H01L 23/49513* (2013.01); *H01L 2224/0401* (2013.01); *H01L 2224/04042* (2013.01); *H01L 2224/05553* (2013.01); *H01L 2224/0603* (2013.01); *H01L 2224/16145* (2013.01); *H01L 2224/16245* (2013.01); *H01L 2224/32245* (2013.01); *H01L 2224/37147* (2013.01); *H01L 2224/40095* (2013.01); *H01L 2224/40245* (2013.01); *H01L 2224/40247* (2013.01); *H01L 2224/40475* (2013.01); *H01L 2224/4103* (2013.01); *H01L 2224/4118* (2013.01); *H01L 2224/41051* (2013.01); *H01L 2224/48091* (2013.01); *H01L 2224/48247* (2013.01); *H01L 2224/49175* (2013.01); *H01L 2224/73207* (2013.01); *H01L 2224/73221* (2013.01); *H01L 2224/73253* (2013.01); *H01L 2224/73263* (2013.01); *H01L 2924/1305* (2013.01); *H01L 2924/13055* (2013.01); *H01L 2924/13091* (2013.01); *H01L 2924/181* (2013.01)

(58) Field of Classification Search
CPC .... H01L 24/40; H01L 24/41; H01L 23/49537
See application file for complete search history.

(56) References Cited

U.S. PATENT DOCUMENTS

| 7,898,080 B2* | 3/2011 | Otremba | ................ H01L 24/40 |
| | | | 257/685 |
| 7,923,300 B2* | 4/2011 | Bell | ................ H01L 21/823487 |
| | | | 257/676 |

(Continued)

*Primary Examiner* — Laura Menz
(74) *Attorney, Agent, or Firm* — NSIP Law

(57) ABSTRACT

Provided is a semiconductor package. The semiconductor package includes: a first die that is a monolithic type die, a driver circuit and a low-side output power device formed in the first die; a second die disposed above the first die, the second die comprising a high-side output power device; and a first connection unit disposed between the first die and the second die.

21 Claims, 6 Drawing Sheets

(56) References Cited

U.S. PATENT DOCUMENTS

| | | | | |
|---|---|---|---|---|
| 8,062,932 B2* | 11/2011 | Hebert | H01L 23/49524 | 257/502 |
| 8,148,817 B2* | 4/2012 | Hebert | H01L 23/49562 | 257/724 |
| 8,183,662 B2* | 5/2012 | Hebert | H01L 23/49524 | 257/502 |
| 8,203,380 B2* | 6/2012 | Hashimoto | H01L 27/0629 | 327/109 |
| 8,508,052 B2* | 8/2013 | Bell | H01L 21/823487 | 257/337 |
| 8,791,723 B2* | 7/2014 | Mallikarjunaswamy | H01L 21/8221 | 257/E21.705 |
| 9,076,778 B2* | 7/2015 | Hebert | H01L 24/34 | |
| 9,130,095 B2* | 9/2015 | Kim | H01L 31/0504 | |
| 2007/0040260 A1* | 2/2007 | Otremba | H01L 24/40 | 257/686 |
| 2009/0057869 A1* | 3/2009 | Hebert | H01L 24/40 | 257/691 |
| 2010/0001790 A1* | 1/2010 | Hashimoto | H01L 27/0629 | 327/566 |
| 2010/0133674 A1* | 6/2010 | Hebert | H01L 23/49524 | 257/686 |
| 2010/0155915 A1* | 6/2010 | Bell | H01L 21/823487 | 257/676 |
| 2011/0163434 A1* | 7/2011 | Bell | H01L 21/823487 | 257/676 |
| 2011/0272792 A1* | 11/2011 | Gruenhagen | H01L 21/6835 | 257/666 |
| 2012/0032244 A1* | 2/2012 | Hebert | H01L 23/49524 | 257/299 |
| 2012/0098090 A1* | 4/2012 | Hebert | H01L 23/49524 | 257/532 |
| 2012/0181996 A1* | 7/2012 | Gehrke | H01L 23/495 | 323/271 |
| 2013/0043940 A1* | 2/2013 | Hebert | H01L 23/3732 | 327/564 |
| 2014/0003179 A1* | 1/2014 | Girdhar | H01L 21/50 | 365/226 |
| 2014/0049293 A1* | 2/2014 | Mallikarjunaswamy | H01L 21/8221 | 327/108 |
| 2014/0070329 A1* | 3/2014 | Flores | H01L 23/49575 | 257/401 |
| 2014/0097529 A1* | 4/2014 | Cruz | H01L 23/49541 | 257/676 |
| 2014/0240945 A1* | 8/2014 | Hosseini | H01L 23/49575 | 361/782 |
| 2015/0001618 A1* | 1/2015 | Hebert | H01L 24/37 | 257/337 |
| 2015/0001695 A1* | 1/2015 | Hebert | H01L 24/40 | 257/675 |

* cited by examiner

SEMICONDUCTOR PACKAGE

CROSS-REFERENCE TO RELATED APPLICATION

This application claims the benefit under 35 U.S.C. §119(a) of Korean Patent Application No. 10-2013-0075983 filed on Jun. 28, 2013, in the Korean Intellectual Property Office, the entire disclosure of which is incorporated herein by reference for all purposes.

BACKGROUND

1. Field

The following description relates to a semiconductor package, and to, for example, a semiconductor package including a first semiconductor die that is a monolithic type die in which a driver circuit and a low-side output power device are included and a second semiconductor die having a high-side output power device.

2. Description of Related Art

In recent years, demands on portable products have rapidly increased in the electronic product market. To meet the demand of making electronic products portable, parts that are mounted on portable systems are also inevitably produced with minimized size, weight and thickness.

To produce parts that are minimized in size, weight and thickness, various technologies for reducing the size of individual mounted parts are utilized. These technologies include system on chip (SOC) technology for making a plurality of individual devices into one chip, system in package (SIP) technology for integrating a plurality of individual devices into one package, and other similar technologies.

In recent years, with the trends of versatility of functions performed by and the miniaturization of mobile communication terminals, various parts embedded in terminals or modules embedded in a handset apparatus related thereto have been minimized in size. Mobile communication terminals include, for example, portable phones, personal digital assistants (PDAs), smart phones and various terminals for media, such as MP3 players. Miniaturization technology also applies to other computing products such as tablet computers and new generation small-form-factor notebook computers referred to as UltraBooks. For miniaturization of the modules, studies on implementing parts of passive devices, active devices, and integrated circuit (IC) chips in one package have been attempted.

As a result, the number of module products is increasing, and various kinds of packages have been developed and released to support the growing demand of miniaturized modules. For example, companies have developed various package technologies that simultaneously improve an output power density of a semiconductor device and reduce production cost.

With this effort, 3D stacking technology for three-dimensionally coupling semiconductor dies has developed, and semiconductor packages integrated as compared with the related art have developed. However, since a driver circuit, a low-side output power device, and a high-side output power device are configured in separate semiconductor dies from each other, there are limitations on the integration of semiconductor packages (see Korean Laid-open Patent No. 10-2011-0074570 and US Laid-open patent No. 2013-0043940).

SUMMARY

In one general aspect, there is provided a semiconductor package, including: a first die including a low-side lateral double diffused metal oxide semiconductor (LDMOS); a second die disposed above the first die; a high-side LDMOS formed in the second die as a flip chip; and a connection unit disposed between the first die and the second die, in which the second die includes an electrode on a bottom thereof, with no electrode disposed on a top surface of the second die.

The connection unit may include a copper clip.

The low-side LDMOS may include a bottom-source LDMOS.

A source region of the bottom-source LDMOS may be connected to a power electrode disposed on a bottom surface of the first die, and a source current may be grounded.

The general aspect of the semiconductor package may further include a high concentration doping region formed on the power electrode.

The high concentration doping region and the source region of the bottom-source LDMOS may be connected using a trench.

The first die may further include a driver circuit or a control circuit.

The driver circuit or the control circuit may be formed in a monolithic type die including the bottom-source LDMOS.

The high-side LDMOS may include a VDMOS.

The high-side LDMOS may include a bottom-drain LDMOS.

The general aspect of the semiconductor package may further include a lead frame that is electrically connected to the connection unit and including a plurality of tie-bars and an outer frame.

The general aspect of the semiconductor package may further include a heat sink configured to dissipate heat generated inside the semiconductor package to outside.

In another general aspect, there is provided a semiconductor package including: a first die that is a monolithic type die, a driver circuit and a low-side output power device formed in the first die; a second die disposed above the first die, the second die including a high-side output power device; a first connection unit disposed between the first die and the second die; and a second connection unit disposed on the second die.

The low-side output power device may include a bottom-source lateral double diffused metal oxide semiconductor (LDMOS).

The first die may include a power electrode provided on a bottom surface thereof.

The power electrode may be electrically connected to a power ground.

The first and second connection units may include a copper clip.

The high-side output power device may include a bottom-source LDMOS that is unflipped.

The high-side output power device may include a VDMOS.

The high-side output power device may include a bottom-drain LDMOS.

The second die may include electrodes formed on both a top surface and a bottom surface thereof.

The high-side output power device may include a bottom-source LDMOS that is a flip chip.

A source region of the bottom-source LDMOS may be connected to a power electrode provided on a bottom surface of the first die, and a source current may be grounded.

The general aspect of the semiconductor package may further include a high concentration doping region on the power electrode, and the high concentration doping region and a source region of the bottom-source LDMOS may be connected using a trench.

The electrode formed on the bottom surface of the second die may be a power electrode configured to be grounded by a lead frame disposed between the first die and the second die.

In another general aspect, a mobile communication terminal including a semiconductor package as described above is provided.

Other features and aspects may be apparent from the following detailed description, the drawings, and the claims.

Figure 1:
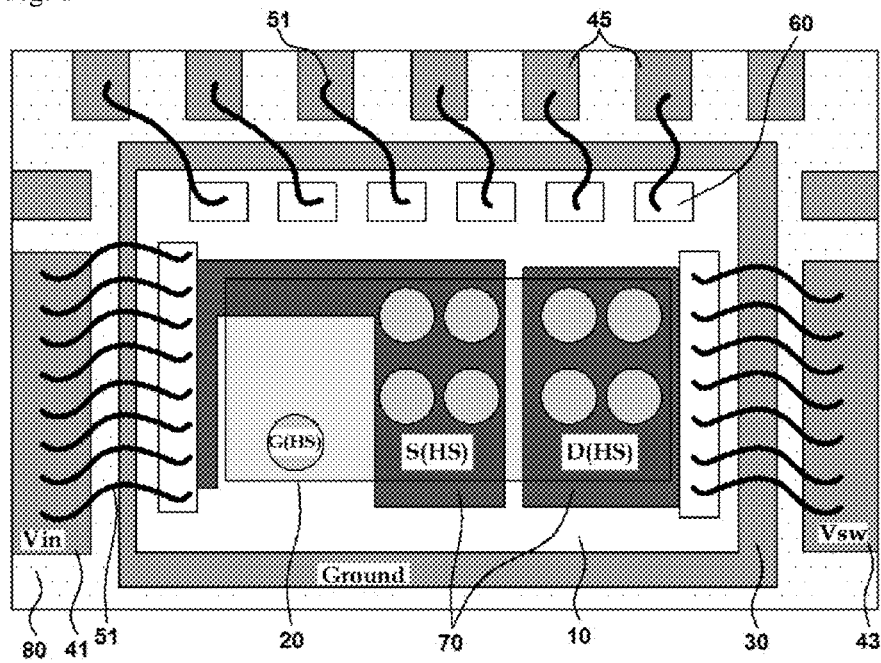
FIG. 1 is a top view of an example of a semiconductor package.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It will be understood that, although the terms first, second, A, B, and the like may be used herein in reference to various elements, features and steps of devices and methods, such elements, features and steps should not be construed as limited by these terms. For example, a first element could be termed a second element, and a second element could be termed a first element, without departing from the scope of the present disclosure. Herein, the term "and/or" includes any and all combinations of one or more referents.

The terminology used herein is for the purpose of describing an example for illustrative purposes and is not intended to limit the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, various examples will be described with reference to the accompanying drawings.

Figure 2:
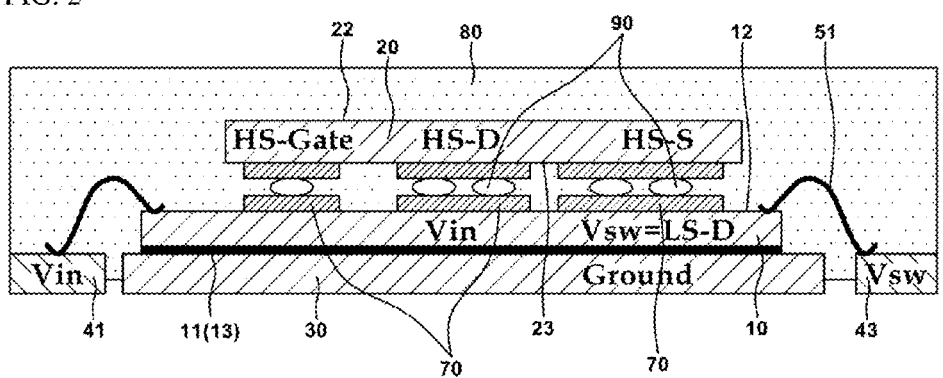
FIG. 2 is a cross-sectional view of an example of a semiconductor package.

FIG. 1 is a top view of an example of a semiconductor package according to the present disclosure, and FIG. 2 is a side view of the example of the semiconductor package illustrated in FIG. 1.

Referring to FIGS. 1 and 2, the semiconductor package includes a monolithic type first die 10 in which a driver circuit and a low-side output power device are included. A backmetal 11 is formed on a bottom surface of the first die 10. The semiconductor package further includes: a second die 20 that is formed on the first die 10 and a high-side output power device is included therein; a first lead frame 30 disposed below the first die 10 and electrically connected to the backmetal 11 of the first die 10; a second lead frame 41, 43, and 45 disposed in a peripheral portion of the first die 10 and disposed on the same plane as the first lead frame 30; and a bonding wire 51 configured to electrically connect the top surface 12 of the first die 10 to one or more portions of the second lead frame 41, 43 and 45.

The low-side and high-side output power devices may include an extended drain Double Diffused MOSFET (ED-MOS), a lateral double diffused MOSFET (LDMOS), a power MOSFET, an insulated gate bipolar transistor (IGBT), a fast recovery diode (FRD), a double diffused MOSFET (DMOS), a trench gate MOS field effect transistor (FET), a split gate MOSFET, a synchronous rectification MOSFET (SRMOSFET), a vertical DMOS (VDMOS), and the like. Various examples described herein relate to an LDMOS device among these devices. This is because the LDMOS device can be easily fabricated through a bipolar/ CMOS/DMOS (BCD) process to be described below. The low-side output power device uses a bottom-source LDMOS among the LDMOS devices. That is, in the bottom-source LDMOS, a source region formed in a surface of a substrate is connected to a low resistance (metal for example) interconnection layer, a metal electrode or a power electrode, or a backmetal; thus, a source current flows out toward a rear side of the substrate. Therefore, the source region of the low-side device is power-grounded.

The driver circuit (or a control and driver circuit) configured to control driving of semiconductor devices and the low-side output power device electrically connected to a switching voltage and a ground voltage to be driven are included in the first die 10, which is a monolithic type die. The first die 10 may be fabricated through various semiconductor processes, such as BiCMOS, BCD and the like. As an example, a method for fabricating the semiconductor die 10 will be described below.

First, the first die 10 may include a P+ highly doped substrate and a P type epitaxial layer formed on the substrate. Next, a low-cost simplified BCD process may be used for forming a driver circuit, or a control circuit. A backmetal, a metal electrode, or a power electrode, like those described above, may be formed on the bottom surface of the substrate. If an N-type substrate is used for an application, an N+ highly-doped substrate can be used instead.

A source region of the low-side output power device may be configured to be electrically connected to the substrate in the first die 10. A trench penetrating the source region and reaching the high concentration N type or P type region is formed. A conductive metal or doped polysilicon may be deposited in the penetrating trench. Other than the trench, a high concentration region is formed using ion implantation of the appropriate dopant specie between the high concentration N type or P type region and the source region to connect therebetween.

In one example, the low-side output power device and the substrate may be fabricated to be electrically connected to each other through one or more method selected from among a doped region formed of a singer, a trench filled with a conductor (for example, doped polysilicon), a trench filled with a metal (silicide, tungsten, or a combination thereof), a combination of the sinker and the trench, and a Though Silicon Via (TSV), and the like.

The low-side output power device and the substrate may be configured such that the low-side output power device and the substrate may be electrically connected by a trench or a sinker formed within an active cell of the low-side output power device.

The low-side output power device and the substrate may be configured such that the low-side output power device and the substrate may be electrically connected by a trench or a sinker formed in an outer periphery of the low-side output power device.

The low-side output power device and the substrate may be configured such that the low-side output power device and the substrate may be electrically connected by a trench or a sinker connected to the low-side output power device through a metal.

Referring to FIG. 2, the backmetal 11 is formed on a bottom surface of the first die 10. In this example, the backmetal 11 is used as an electrode for a power ground of the source region. The backmetal 11 may be formed by using various semiconductor fabrication processes. In one example, the back-side backmetal 11 formed on a bottom surface of the first die 10 may include a standard metal such as Ti/Ni/Ag commonly used in a vertical power MOSFETs, or Ti/Ni/Au, or an electrical conductive material such as CrAu, or Ti/TiN/Al, or Ti/Ni/Cu.

Referring to FIG. 2, the semiconductor die 10 includes the backmetal 11 and is formed of a thinned wafer. Thus, substrate resistance may be minimized In one example, the low-side output power device may include a bottom-source type lateral double diffused metal oxide semiconductor (LDMOS or BS-LDMOS) device. For instance, the low-side output power device may include an LDMOS device having low specific resistance (Rsp, defined as Rdson*Area) and low ON resistance (Rdson), as well as an adequate breakdown voltage (BVdss) for the application, to reduce the switching power device area and die cost.

The backmetal 11 disposed on the bottom surface of the first die 10 is electrically connected to a source region of the LDMOS device and a power electrode. The backmetal 11 may be used as a power electrode of the semiconductor substrate. Thus, the semiconductor package according to such an example may increase efficiency of the low-side output power device and reduce parasitic capacitance and inductance generated therein.

The second die 20 includes a high-side output power device electrically connected to an input voltage and the switching voltage to be driven, regulated or converted. The second die 20 may be fabricated through various semiconductor processes. Examples of such semiconductor processes include, for example, BiCMOS, BCD and the like, similar to the processes that may be used to fabricate the first die 10. Detailed description thereof has been previously made with respect to the fabrication of the first die 10. Thus, the repetitive description will be omitted.

In one example, the high-side output power device of the second die 20 may include an LDMOS device. For example, the high-side output power device may also include an LDMOS device having low specific resistance (Rsp) and low ON resistance (Rdson), and an adequate breakdown voltage (BVdss) for the application, to minimize the die size and cost.

Referring to FIG. 2, the second die 20 is flip-chip mounted on top of die 10. A bottom surface 23 of the second die 20, when flipped, is disposed on top of the first die 10. In this example, the second die 20 may be electrically connected to the top surface 12 of the first die 10 through a conductor 70 and a solder 90 that may be additionally applied on the bottom surface of the second die 20. The electrical connection configuration may be fabricated through various semiconductor processes, including copper pillars, solder bumps, plated solder, and the like.

Through the electrical connection configuration, the second die 20 may receive a gate voltage, a drain voltage, and a source voltage required to drive the high-side output power device. Other optional connections can also be included in the second die 20, such as connections to a temperature and/or current sensor, substrate connections (a backside of the second die 20), and the like.

Referring to FIG. 2, the first lead frame 30 is disposed below the first die 10 that is not flipped. The first lead frame 30 may be disposed on the bottom surface of the first die 10 to be electrically connected to the backmetal 11 of the first die 10. That is, the backmetal 11 may be found on the bottom surface of the first die 10, and the first lead frame 30 may be formed on the backmetal 11. In this example, the first lead frame 30 may include an electrical conductive material selected from the group consisting of Cu, a Cu alloy, nickel-palladium (Ni—Pd), nickel-palladium-gold (Ni—Pd—Au), solder plated copper, and a combination thereof. The thickness of the first lead frame 30 may be in a range of 2 mil (1 mil=0.001 inch) to 10 mil.

In one example, the first lead frame 30 is electrically connected to a ground power. Since the first lead frame 30 is electrically connected to the ground power, the back metal 11 formed on the bottom surface of the first die 10 is electrically connected to the ground power. Therefore, the bottom side of the semiconductor package is grounded. This example of semiconductor package is advantageous in terms of lower ground inductance and improved thermal dissipation through the above-described configuration.

Different portions of the second lead frame are disposed in a peripheral portion of the first die 10 and disposed on the same plane as the first lead frame 30. Referring to FIGS. 1 and 2, various portions of the second lead frame are disposed on the same plane as the first lead frame 30 and disposed in the front or rear side of the first die 10 and to the left and right (or sides) of the first die 10 or the first lead frame 30.

Referring to FIG. 1, the second lead frame may include a first portion 41 of the second lead frame electrically connected to an input voltage, a second portion 43 of the second lead frame electrically connected to a switching voltage that is also referred to as the output or phase node of converter modules, and a third portion 45 of the second lead frame configured to provide a driving control signal or signals. In this example, the third portion 45 of the second lead frame may be disposed in one direction with respect to the first die 10, and the first portion 41 of the second lead may be disposed in another direction. For example, in FIG. 1, the third portion 45 of the second lead frame is disposed in a direction corresponding to an upper side of FIG. 1, and the first portion 41 of the second lead is disposed to the left of the first die 10, or the left side of FIG. 1, on the basis of the third portion 45 of the second lead frame. The second portion 43 of the second lead frame may be disposed to the right of the first die 10, or in the right side of FIG. 1, on the basis of the third portion 45 of the second lead frame. However, the arrangement of the second lead frame is not limited thereto, and the first portion 41 of the second lead frame and the second portion 43 of the second lead frame may be disposed to the right and left of the first die 10 with respect to the third portion of the second lead frame 45, or the first portion of the second lead frame 41 and the third portion 45 of the second lead frame may be disposed to face each other. Further, the third portion 45 may be disposed in two directions with respect to the first die 10. For example, the third portion 45 of the second lead frame may be disposed to the left and right of the first die 10 or disposed in the upper side and left side of the first die 10.

The bonding wire 51 electrically connects the top surface 12 of the first die 10 and the second lead frame 41, 43, and 45. For example, as illustrated in FIG. 1, the bonding wire 51 may electrically connect the top surface 12 of the first die 10 and the second lead frame 41, 43, and 45 through a bonding pad 60 formed on the top surface 12 of the first die 10. In this example, the bonding wire 51 configured to connect the first portion 41 of the second lead frame and the second portion 43 of the second lead frame to the first die 10 may include a bonding wire 51 having a thickness of 0.8 to 2 mil thickness or a diameter range of approximately 2 mil, and the bonding wire 51 configured to connect the third portion 45 of the second lead frame to the first die 10 may include a bonding wire 51 having a thickness or a diameter of 0.8 mil to 2 mil, or approximately 1 mil. Through the above-described configuration, the input voltage and switching voltage and a specific driving control signal to circuits included in the first die 10 may be provided.

The bonding wire 51 may include an electrical conductive material selected from the group consisting of Cu, Au, aluminum (Al), and a combination thereof. Other than the above-described materials, the bonding wire 51 may be formed with various electrical conductive materials.

To transfer the input voltage and the switching voltage from the first portion 41 and the second portion 43 of the second lead frame to certain regions of the first die 10 and the bottom surface of the second die 20, conductors 70 may be formed on the top surface 12 of the first die 10 and the bottom surface 23 of the second die 20.

In one example, technical representation such as "first" and "second" to distinguish the configuration of the entire technology to facilitate the explanation does not indicate different technology configurations. For example, the first lead frame, the lead frame, and the second lead frame may be separately designated to facilitate the explanation of the technology. However, the first lead frame and the second lead frame may not differ structurally. In addition, the input lead frame, the switching lead frame and lead frame control and the entire lead frame may be separated by area, but this does not indicate different technology configurations.

In one example, the semiconductor package may further include an encapsulant 80 configured to encapsulate the first die 10, the second die 20, the first lead frame 30, the second lead frame 41, 43, and 45, and the bonding wire 51. In this example, the encapsulant 80 may encapsulate the first lead frame 30 and the second lead frame 41, 43, and 45, excluding the bottom surfaces of the first lead frame 30 and second lead frame. The encapsulation provides a robust semiconductor package that is resistant against an external shock. The encapsulant 80 may comprise mold compound, which is well known to those skilled in the art.

In one example, the semiconductor package may further include a heat sink configured to dissipate heat generated from devices therein to the outside. The semiconductor package may control temperatures of the devices therein through the heat sink to improve endurance. The heat sink can be copper block or plate in contact with a top surface 22 of the second die 20 encapsulated by the encapsulant, to facilitate heat conduction outside of the package.

The semiconductor package including the bonding wire 51 may be applied to a semiconductor circuit driven with a low current. For example, the semiconductor package may be applied to a circuit driven with a current of 5 to 6 Amperes or less, mainly because of the fact that bonding wires 51 are used to connect the input and output power electrodes.

Further, the semiconductor package according to an example may be fabricated more easily since a separate electrode is not formed on the top surface 22 of the second die 20. The separate configurations that electrically connect to the top surface 22 of the second die 20 may not be required. Also, the second die 20 does not require any special metallization process with respect to the top surface 22.

According to an example, a copper clip is not required or included. Thus, a thin semiconductor package may be provided at a lower cost.

Figure 3:
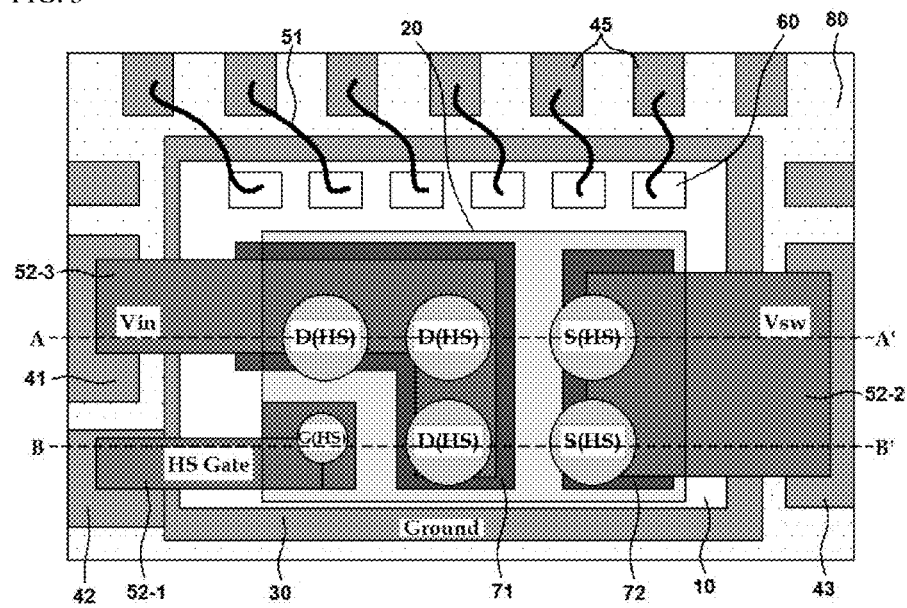
FIG. 3 is a top view of another example of a semiconductor package.
Figure 4:
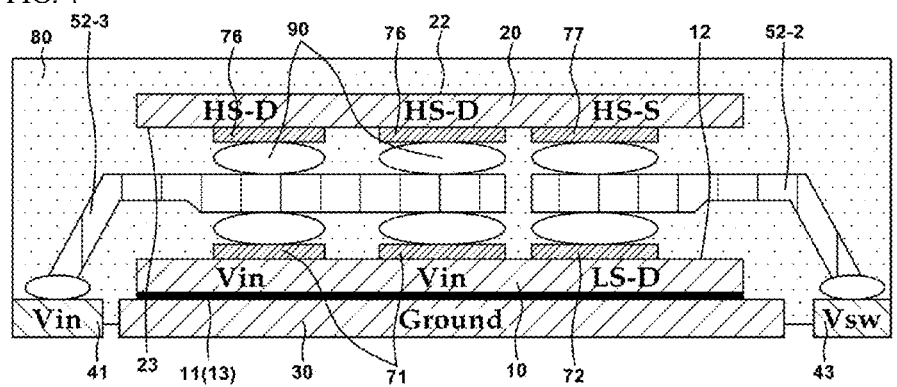
FIG. 4 is a cross-sectional view of the semiconductor package of FIG. 3 taken along line A-A'.
Figure 5:
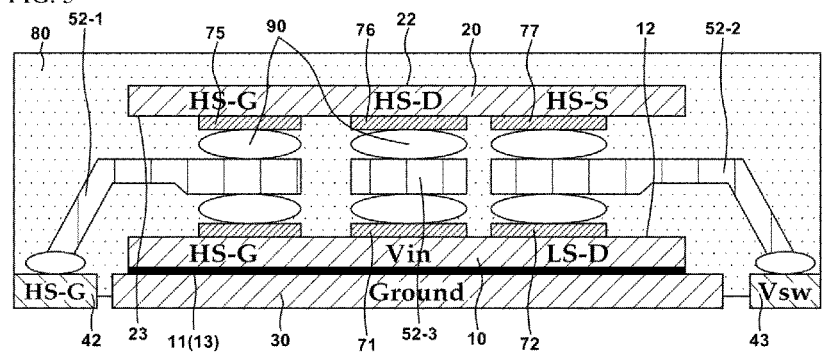
FIG. 5 is a cross-sectional view of the semiconductor package of FIG. 3 taken along line B-B'.

FIGS. 3 to 5 are a top and side views of another example of a semiconductor package according to the present disclosure.

Referring to FIGS. 3 to 5, a semiconductor package includes: a first die 10 having a bottom-source low-side LDMOS; a second die 20 having a flip-chip mounted high-side LDMOS with a bottom surface 23 having electrodes formed thereon and a top surface 22 without electrodes formed thereon, the second die 20 disposed on the first die; and a copper clip 52 that electrically connects to the first die 10 and the second die 20. Various portions of a lead frame 30, 41, 42, 43, and 45 are electrically connected to the copper clip 52. The portions of lead frame 30, 41, 42, 43 and 45 are configured of a plurality of tie-bars and an outer frame may be electrically connected to a portion of the first die 10 or the second die 20, and provide a ground voltage, input voltage, gate voltage, and switching voltage (or output), respectively. Hereinafter, a portion of the lead frame that is electrically connected to the ground voltage is referred to as a ground lead frame 30. A portion of the lead frame that is electrically connected to the input voltage is referred to as an input lead frame 41. A portion of the lead frame that is electrically connected to the switching voltage is referred to as a switching lead frame 43. Also, a portion of the lead frame that provides a control or driving signal is referred to as a control lead frame 45.

In the description, the expression "tie-bar" is used to refer to the portion of the copper clip that bends down, and touches the lead frame. Also, the "tie bar" refers to the pieces of metal that are used to hold the copper clips together in a lead frame.

Regarding the first die 10 and the second die 20, the description that is repetitive of the above-described examples will be omitted.

Referring to FIGS. 4 and 5, the low-side LDMOS included in the first die 10 connects to the backmetal 11 formed on a bottom surface 13 of the first die 10, to allow for the source current to flow. For example, a source of the low-side LDMOS and the backmetal 11 of the first die 10 are electrically connected to allow for the source current of the low-side LDMOS to flow out through the bottom side of the semiconductor package.

The first die 10 that includes the low-side LDMOS may also include an electrode connected to a drain of the low-side LDMOS. Similar to this, the second die 20 that includes the high-side LDMOS may include a conductor 75 for a gate electrode connected to the gate electrode, a conductor 76 for a drain electrode connected to the drain electrode, and a conductor 77 for a source electrode connected to the source electrode.

In a semiconductor package according to one example, the first die 10 may further include a driver circuit or a control circuit. The conductor 75 for the gate electrode of the second die may be electrically connected to the driver circuit or the control circuit of the first die 10.

FIG. 4 illustrates a cross-sectional view of an example of a semiconductor package taken along line A-A' of FIG. 3. Referring to FIG. 4, the copper clip 52 is divided into two portions. One portion is a third portion 52-3 of the copper clip 52, and is connected to the input lead frame 41. The second portion 52-2 is responsible for the switch voltage and is connected to the switching lead frame 43. Referring to FIG. 5, the other portion is a first portion 52-1 and is electrically connected to the gate lead frame 42.

FIG. 5 illustrates a cross-sectional view of the semiconductor package of FIG. 3 taken along line B-B' depicted in FIG. 3. As illustrated in FIG. 5, the copper clip 52 may include a first portion 52-1 that is electrically connected to the gate electrode of the high-side output power device, the second portion 52-2 that is electrically connected to the drain electrode of the low-side and the source of the high-side output power devices and to the switching lead frame 43, and the third portion 52-3 that is electrically connected to the drain electrode of the high-side output power device and the input voltage connection 71 on the bottom die 10. The second copper clip 52 may be formed in an middle region between the first die 10 and the second die 20. The second copper clip 52 may be configured to connect to corresponding electrodes in the first die 10 and the second die 20, so that the second die 20 could provide the gate voltage, the drain voltage, and the source voltage for driving the high-side output power device. The second die 20 may be connected to temperature and/or current sensor connections, and the like, through additional lead frames.

In this example, the electrodes 71 and 72 of the first die 10 and the copper clip 52 may be electrically connected by a solder 90. Also, the electrodes 75, 76, and 77 of the second die 20 and the copper clip 52 may be electrically connected by the solder 90.

In one example, the semiconductor package may further include a heat sink (not shown). The heat sink may be disposed on the top surface of the second die 20 and be configured to dissipate heat generated from devices therein to the outside. The semiconductor package may control temperatures of the devices therein through the heat sink to improve endurance.

The semiconductor package that includes the copper clip may have characteristic to be driven, for example, with a high current of 6 Amperes or more. Further, since the semiconductor package may be fabricated only using one clip attachment process, the fabrication process may be simplified to reduce manufacturing cost and time. Since a separate electrode forming process is excluded when the second die 20 is fabricated in the semiconductor package, the semiconductor package may be easily fabricated.

Figure 6:
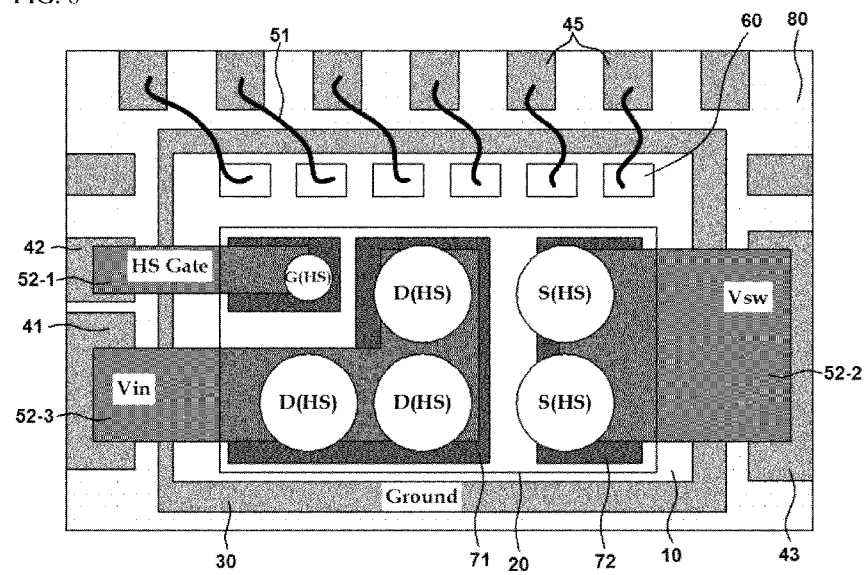
FIG. 6 is a top view of another example of a semiconductor package according to a modified example of the semiconductor package of FIG. 3.

FIG. 6 illustrates an example in which the locations of the copper clip for gate connection and the copper clip for an input voltage in the high-side LDMOS device are changed.

Figure 7:
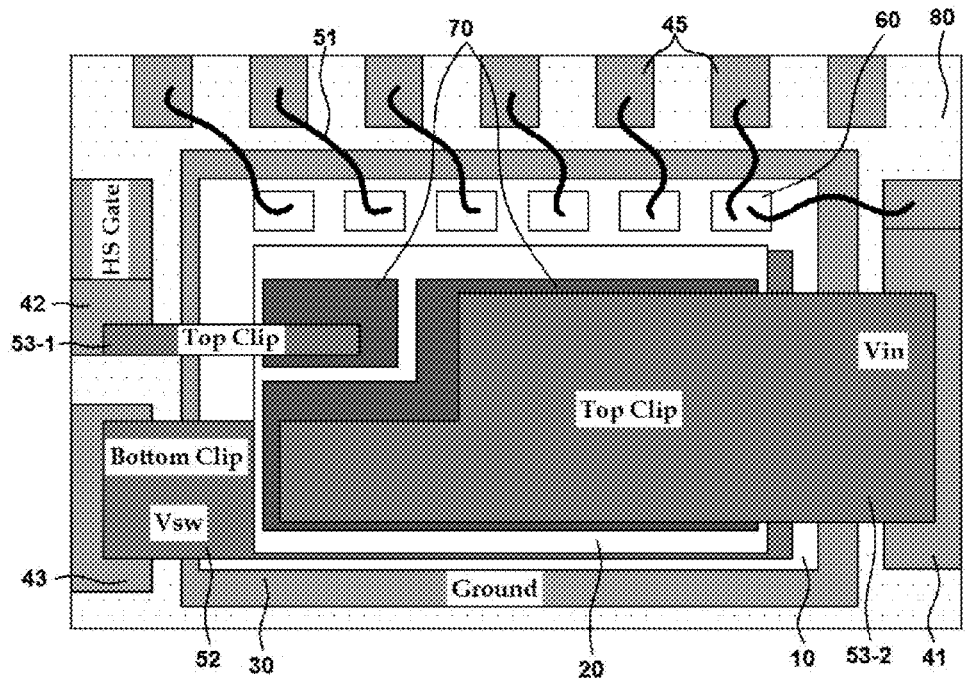
FIG. 7 is a top view illustrating another example of a semiconductor package.
Figure 8:
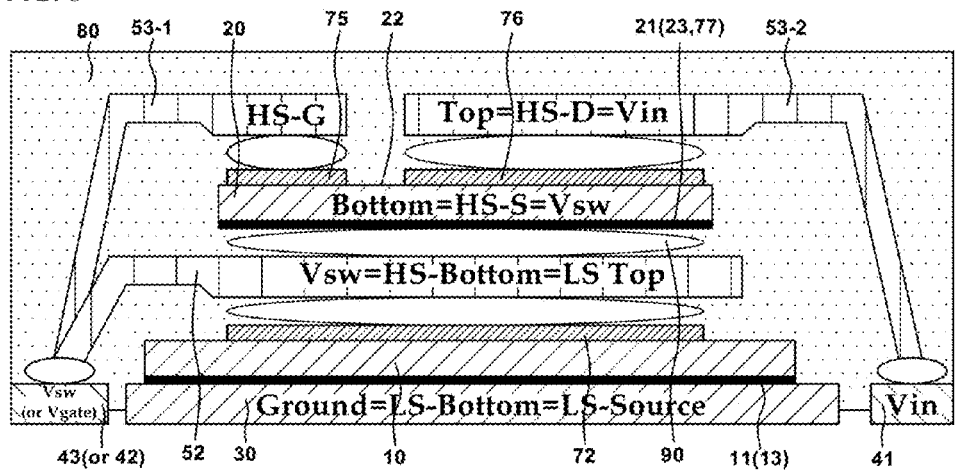
FIG. 8 is a side view illustrating another example of a semiconductor package.

FIGS. 7 and 8 illustrate a top view and a cross-sectional view of a semiconductor package according to another example.

Referring to FIGS. 7 and 8, a semiconductor package according to another example includes a first die 10, a second die 20, a first copper clip, and a second copper clip 52. The first die 10 is a monolithic type die that includes a driver circuit and a bottom-source low-side output power device. A second die 20 is stacked on a top surface 12 of the first die 10, and has a high-side output power device. A first copper clip 52 is disposed between the first die and the second die. A second copper clip 53 is connected to a top surface 22 of the second die 20. In this example, the second die 20 is formed without being flipped.

Regarding the first die 10 and the second die 20, the description that is repetitive of the above-described examples will be omitted.

Referring to FIG. 8, the first die 10 and the second die 20 may include a bottom-source type LDMOS (or BS-LDMOS) device. All of the low-side BS-LDMOS formed in the first die 10 and the high-side BS-LDMOS formed in the second die 20 are not flipped. As an example, a N type channel LDMOS that is not flipped may be applied to the second die 20. The high-side LDMOS included in the second die 20 includes a gate region, a drain region, and a source region. Conductors 75 and 76 connected to the gate region and the drain region of the LDMOS device are exposed in the top surface of the second die 20. Conductors 21, 23 and 77 located on the bottom thereof may be used as the power electrode and is grounded by a lead frame located on bottom sides of the conductors 21, 23 and 77. Thus, this example of semiconductor package may increase efficiency of the high-side output power device and reduce parasitic capacitance and inductance generated therein.

In addition, the second die 20 may include the conductor 75 for the gate electrode 75, the conductor 76 for the drain electrode, and the conductor 77 for the source electrode. The first side 10 may include an electrode 72 that is connected to a drain region of the low-side output power device.

Referring to FIG. 8, the copper clip includes the first copper clip 52 and the second copper clip 53. The first copper clip 52 is disposed between the high-side LDMOS device and the low-side LDMOS device to electrically connect the electrode connected to the drain region of the low-side LDMOS device and the conductor for the source electrode of the high-side LDMOS device, and is configured to allow an output current flow to the switching lead frame 43 through the first copper clip 52. This is possible because the first copper clip 52 and the switching lead frame are electrically connected.

The second copper clip 53 may include a first portion 53-1 disposed on the top of the high-side LDMOS and electrically connected to the conductor 75 for the gate electrode via a solder 90, and a second portion 53-2 electrically connected to the conductor 76 for the drain electrode via a solder 90.

Through those technical configurations, the low-side output power device in the first die 10 and the high-side output power device in the second die 20 may be provided with necessary voltage for their operation, respectively.

Referring to FIG. 8, the semiconductor package may further include an encapsulant 80 configured to encapsulate the first die 10, the second die 20, the lead frame 30,41,42, 43, and 45, the first copper clip 52, and the second copper clip 53. In this example, the encapsulant 80 encapsulates the lead frame 30,41,42,43, and 45, while excluding the bottom surfaces of the lead frame 30,41,42,43 and 45. Thus, the encapsulation results in a robust semiconductor package is resistant against an external shock.

Referring to FIG. 8, the electrode 72 on the first die 10 and the first copper clip 52, the first copper clip 52 and a backmetal 21 of the second die 20, the electrode 75 and the second copper clip 53-1, and the electrode 76 and the second copper clip 53-2 are electrically connected to each other by a solder 90. However, the use of the solder 90 is optional, and other methods may be used to form the electrical connection.

In one example, the semiconductor package may further include a heat sink (not shown) installed on the second copper clip and configured to dissipate heat generated from devices therein to the outside. The semiconductor package may control temperatures of the devices therein through the heat sink to improve endurance.

Unlike the above-described examples, the low-side output power device may include a bottom-source type LDMOS (or BS-LDMOS) device, and the high-side output power device may include a vertical P channel VDMOS device. For instance, the Vertical Double Diffused MOSFET VDMOS is configured not to be flipped. The bottom of the second die 20 becomes the drain electrode of the high-side power output device, and the gate and the source may be disposed on the top side of the second die 20.

The other technical configurations are the same as the above-described examples; thus, the detailed description thereof will be omitted.

Figure 9:
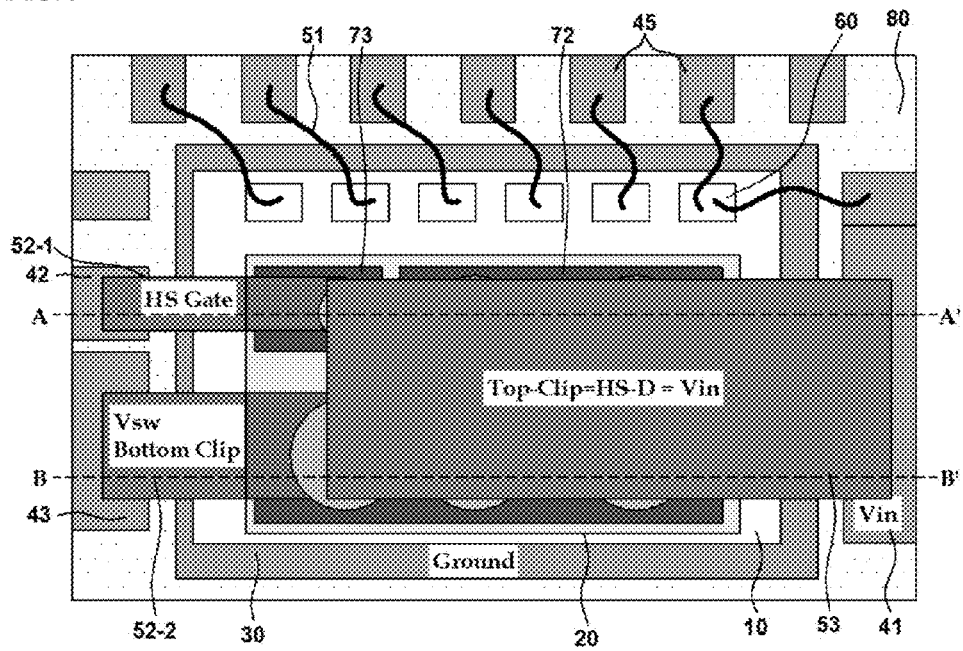
FIG. 9 is a top view illustrating another example of a semiconductor package.
Figure 10:
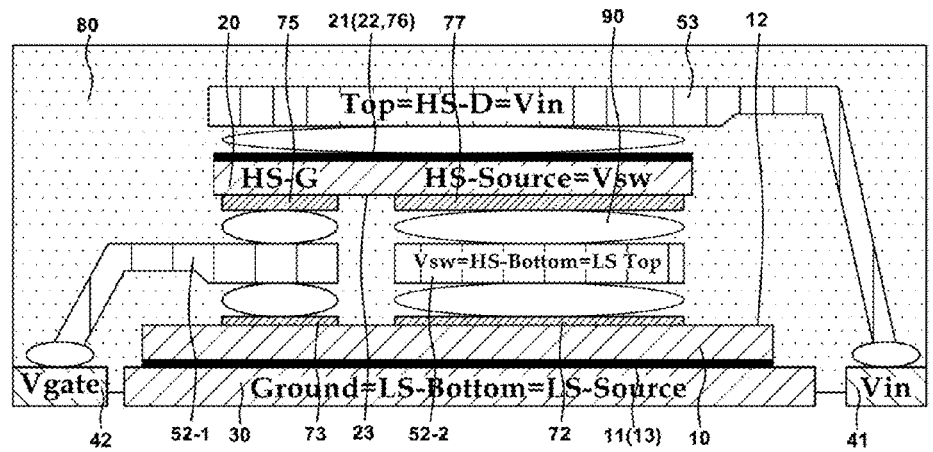
FIG. 10 is a cross-sectional view illustrating the semiconductor package of FIG. 9 taken along line A-A'.
Figure 11:
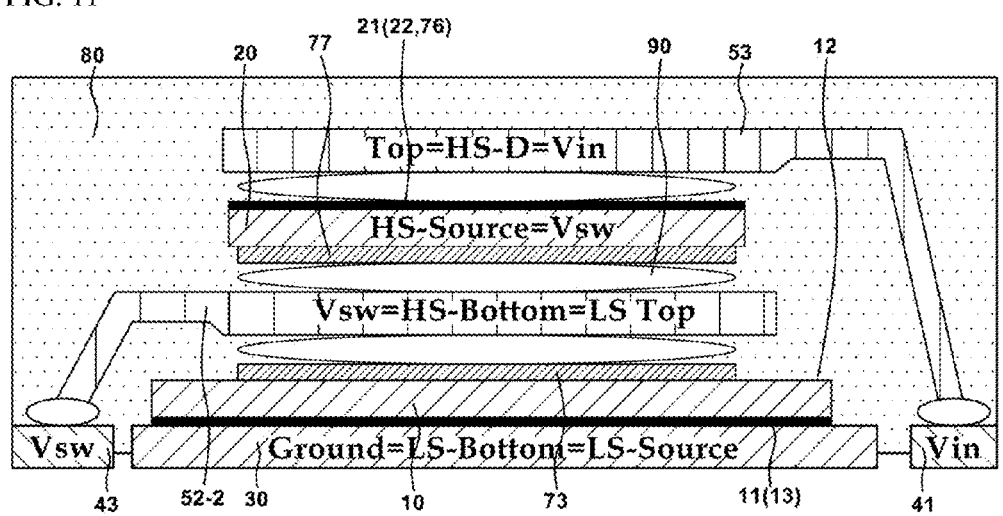
FIG. 11 is a cross-sectional view illustrating the semiconductor package of FIG. 9 taken along line B-B'.

FIGS. 9 to 11 are a top view and cross-sectional views of another example of a semiconductor packages according to the present disclosure. Like the above-described examples, two clips are provided. However, a flip chip is used in this example. For instance, in the illustrated example, an LDMOS that is a flip-chip device is used in the second die.

Referring to FIGS. 9 to 11, a semiconductor package includes a first die 10, a second die 20, a first copper clip 52, and a second copper clip 53. The first die 10 is a monolithic type die and includes a driver circuit and a bottom-source low-side output power device. A second die 20 is stacked on a top surface 12 of the first die, and has a high-side output power device. A first copper clip 52 is disposed between the first die 10 and the second die 20. A second copper clip 53 is connected to a top surface 22 of the second die 20. The high-side output power device of the second die 20 is flip-chip mounted above the first die 10 that is not flipped.

As the high-side output power device described above, an N type channel VDMOS may be used. In the N channel VDMOS, a gate and a source region is formed on one side, and a drain region is formed on the other side. An LDMOS with the drain at the bottom, referred to as a BD-LDMOS (Bottom Drain LDMOS) and source and gate electrodes on the top (when viewed in the non-flipped configuration) can also be used. Therefore, as described above, when the N Channel VDMOS or BD-LDMOS device is provided in the second die in a flip-chip state, the gate and the source region of the LDMOS are exposed downward and the drain region is exposed upward.

Referring to FIG. 10, the second die 20 includes a high-side output power device that is electrically connected to an input voltage and a switching voltage to be driven.

Further, a backmetal 21 is formed on a top surface of the second die 20, and a bottom surface 23 of the second die 20 is electrically connected to the top surface 12 of the first die 10. The second die 20 includes a flip-chip device. That is, the second die 20 is flipped so that an original top of the second die 20 becomes the bottom surface 23 of the second die 20 in FIGS. 9 to 11.

An N type channel VDMOS is applied as the high-side output power device included in the second die 20.

Description regarding the first die 10 and the second die 10 that is repetitive of the above-described examples will be omitted.

Referring to FIG. 10, the second die 20 may include a conductor 75 for a gate electrode, a conductor 76 for a drain electrode, and a conductor 77 for a source electrode. The second die 20 of FIGS. 9 to 11 is configured as a flip chip so that an original top of the second die 20 becomes the bottom 23 of the second die 20 in FIGS. 9 to 11. The conductor for the drain electrode is corresponding to the backmetal 21 of the second die 20. The conductor 75 for the gate electrode and the conductor 77 for the source electrode may be formed on the bottom 23 of the second die 20.

In one example, an N type channel BS-LDMOS configured as a flip-chip device may be used as the second die 20.

Referring to FIG. 10, the copper clip 52 is divided into two portions. One portion is a first portion 52-1 of the copper clip 52, and is connected to the conductor 75 for the gate electrode of the high-side LDMOS (BD-LDMOS) or the high-side VDMOS device. The other portion is a second portion 52-2 and is electrically connected to the conductor 77 for the source electrode of the high-side LDMOS device. The second portion is electrically connected to a drain region of the low-side LDMOS device through a solder. A current is flow output to the switching lead frame through the copper clip of the second portion. The first portion 52-1 of the copper clip 52 is electrically connected to a gate lead frame 42.

The second copper clip 53 may be electrically connected to the conductor 76 of the drain electrode of the second die 20. Through the above-described configuration, the high-side output power device may provide voltages required to drive the high-side output power device in the second die 20.

A backmetal 11 of the first die 10 may be electrically connected to the ground power. For instance, the backmetal 11 of the first die 10 may be electrically connected to a ground lead frame connected to the ground power, and this may be connected to the power ground.

The semiconductor package may further include a heat sink (not shown) that is configured to dissipate heat generated from devices therein to the outside. The semiconductor package may control temperatures of the devices therein through the heat sink to improve endurance.

An example of a semiconductor package as described above may be capable of improving a degree of integration. Further, an example of a semiconductor package as described above may enable the use of simplified IC process by configuring a low-side output power device and a high-side output power device into semiconductor dies separated from each other.

An example of a semiconductor package described above has high output power density by configuring a high-side output power device in a separate semiconductor die and may be capable of reducing the surface area of the final product by using a stacking structure and approach.

According to an example, a semiconductor package may include: a first die including a low-side lateral double diffused metal oxide semiconductor (LDMOS); a second die including a flip-chip high-side LDMOS, wherein the second die includes an electrode on a bottom thereof, and an electrode is not included in a top thereof; and a connection unit configured to electrically connect a top of the first die and the bottom of the second die. The second die may be formed to be stacked on a top of the first die.

The connection unit may include a bonding wire configured to electrically connect the top of the first die and the bottom of the second die.

The connection unit may include a copper clip configured to electrically connect the top of the first die and the bottom of the second die, and the copper clip may include a first portion for a gate voltage, a second portion for a switching voltage, and a third portion for an input voltage.

The low-side LDMOS may be electrically connected to a backmetal of a bottom of the first die and a source current is grounded.

The first die may include a first electrode for an input voltage and a second electrode for a switching voltage, and the second die may include a gate electrode, a drain electrode, and a source electrode.

The drain electrode of the second die may be electrically connected to the first electrode of the first die and the source electrode of the second die may be electrically connected to the second electrode of the first die.

The first die may further include a driver circuit or a control circuit, and the gate electrode of the second die may be electrically connected to the driver circuit or a control circuit of the first die.

One example of a semiconductor package may further include a lead frame electrically connected to the connection unit and including a plurality of tie-bars and an outer frame.

The semiconductor package may further include a heat sink configured to dissipate heat generated from the devices therein to the outside.

The low-side LDMOS may be connected to a substrate of the first die and the backmetal of the first die may be directly connected to the source of the low-side LDMOS so that a source current may be flow out through a bottom of the semiconductor package.

According to another example, a semiconductor package may include: a first die in which a driver circuit and a bottom-source low-side output power device are formed in a monolithic type die; a second die formed to be stacked on a top of the first die and including a high-side output power device; a first copper clip configured to electrically connect the top of the first die and a bottom of the second die; and a second copper clip electrically connected to a top of the second die.

The high-side output power device includes a bottom-source LDMOS or a vertical double diffused MOS (VDMOS).

Each of the first die and the second die may include a source electrode configured to directly connect the backmetal of the first die and the backmetal of the second die.

The backmetal of the first die may be electrically connected to a power ground.

The second die may include a gate electrode and a drain electrode formed on the top thereof.

The first die may include a switching electrode for a switching voltage, the first copper clip may configured to electrically connect the switching electrode and the switching voltage, and the second copper clip may include a first portion electrically connected to the gate electrode, and a second portion electrically connected to the drain electrode.

Alternatively, the second die may include a drain electrode formed on a top thereof and a gate electrode and a source electrode formed on a bottom thereof.

The first copper clip may include a portion electrically connected to the gate electrode, and a second portion electrically connected to the source electrode. The first portion may be electrically connected to a lead frame for a gate voltage, and the second portion may be electrically connected to a lead frame for a switching voltage. The second copper clip may be electrically connected to the drain electrode of the second die.

The semiconductor package may further include a lead frame electrically connected to the connection unit and including a plurality of tie-bars and an outer frame.

The low-side LDMOS included in the first die may be connected to a substrate of the first die and the backmetal of the first die may be directly connected to the source of the low-side LDMOS so that a source current may be flow out through a bottom of the semiconductor package.

According to another example, a semiconductor package may be capable of increasing a degree of integration as compared with the related art by three-dimensionally overlapping or stacking two semiconductor dies.

Further, a completely isolated LDMOS device, often referred to as a high-side LDMOS, is not included in the first semiconductor die by configuring a low-side output power device and a high-side output power device in a first the semiconductor die and a second semiconductor die, respectively and thus it is possible to fabricate the semiconductor package without a complicated IC process, while minimizing the total number of semiconductor dies.

The semiconductor package has high output power density by configuring the high-side output power device in a separate semiconductor die which has a stacked structure to reduce the surface area of the final assembly.

The spatially-relative expressions such as "below", "beneath", "lower", "above", "upper" and the like may be used to conveniently describe relationships of one device or elements with other devices or elements. The spatially-relative expressions should be understood as encompassing the direction illustrated in the drawings, added with other directions of the device in use or operation. For example, a device explained as being located "below" or "beneath" another device may also be placed "above" said another device. That is, since the expression "below" or "beneath" is used to provide examples only, the expression may encompass both the upward and downward directions. Further, the device may be oriented to other directions and accordingly, the interpretation of the spatially-relative expressions is based on the orientation.

Further, the expression "a first conductive type" and "a second conductive type" may refer to the conductive types such as N and P types, or P and N types, which are opposed to each other. Examples explained and exemplified herein encompass complementary examples thereof.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor package comprising:
a monolithic type first die comprising a driver circuit and a low-side output power device connected to the driver circuit;
a second die disposed above the first die, the second die comprising a high-side output power device;
a first connection unit connecting a top of the first die and a bottom of the second die; and
a second connection unit disposed on the second die.

2. The semiconductor package of claim 1, wherein the low-side output power device comprises a bottom-source lateral double diffused metal oxide semiconductor (LDMOS).

3. The semiconductor package of claim 1, wherein the first die comprises a power electrode provided on a bottom surface thereof.

4. The semiconductor package of claim 3, wherein the power electrode is electrically connected to a power ground.

5. The semiconductor package of claim 4, wherein a portion of the second connection unit connects an electrode of the high-side output power device to an input voltage.

6. The semiconductor package of claim 1, wherein the high-side output power device comprises a bottom-source LDMOS that is unflipped.

7. The semiconductor package of claim 1, wherein the high-side output power device comprises a VDMOS.

8. The semiconductor package of claim 1, wherein the high-side output power device comprises a bottom-drain LDMOS.

9. The semiconductor package of claim 1, wherein the second die comprises electrodes formed on both a top surface and a bottom surface thereof.

10. The semiconductor package of claim 1, wherein the high-side output power device comprises a bottom-source LDMOS that is a flip chip.

11. The semiconductor package of claim 2, wherein a source region of the bottom-source LDMOS is connected to a power electrode provided on a bottom surface of the first die, and a source current is grounded.

12. The semiconductor package of claim 11, further comprising a high concentration doping region on the power electrode, wherein the high concentration doping region and a source region of the bottom-source LDMOS are connected using a trench.

13. The semiconductor package of claim 9, wherein the electrode formed on the bottom surface of the second die is a power electrode configured to be grounded by a lead frame disposed between the first die and the second die.

14. A mobile communication terminal comprising a semiconductor package of claim 1.

15. The semiconductor package of claim 1, wherein the first die comprises a substrate and a source region of the low-side output power device.

16. The semiconductor package of claim 15, wherein the source region of the low-side output power device is electrically connected with a bottom surface of the substrate through a trench structure, wherein the trench structure is filled with poly-Si or a conductive metal.

17. The semiconductor package of claim 2, further comprising a backmetal disposed on a bottom surface of the first die, wherein the backmetal is electrically connected to a source region of the LDMOS device.

18. The semiconductor package of claim 17, wherein the backmetal comprises a material selected from the group consisting of Ti/Ni/Ag, Ti/Ni/Au, Ti/TiN/Al and Ti/Ni/Cu.

19. A semiconductor package comprising:
a monolithic type first die comprising a driver circuit and a low-side output power device connected to the driver circuit;
a second die disposed above the first die, the second die comprising a high-side output power device; and
a connection unit connecting an electrode on a top surface of the second die to an input voltage.

20. The semiconductor package of claim 19, wherein at least a portion of a bottom surface of the second die is electrically connected to at least a portion of a top surface of the first die.

21. The semiconductor package of claim 19, wherein a source region of the low-side output power device is electrically connected with a backmetal provided on a bottom surface of the first die.

* * * * *